US009880244B2

(12) United States Patent
Hwang et al.

(10) Patent No.: US 9,880,244 B2
(45) Date of Patent: Jan. 30, 2018

(54) METHOD AND APPARATUS FOR SEPARATING CHEMICAL SPECIES IN MAGNETIC RESONANCE IMAGING

(71) Applicants: GENERAL ELECTRIC COMPANY, Schenectady, NY (US); BOARD OF REGENTS, THE UNIVERSITY OF TEXAS SYSTEM, Austin, TX (US)

(72) Inventors: Ken-Pin Hwang, Sugar Land, TX (US); Zachary William Slavens, New Berlin, WI (US); Ersin Bayram, Houston, TX (US); Kang Wang, Madison, WI (US); Daniel Litwiller, Rochester, MN (US); Jingfei Ma, Houston, TX (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 502 days.

(21) Appl. No.: 14/584,501

(22) Filed: Dec. 29, 2014

(65) Prior Publication Data

US 2016/0187447 A1 Jun. 30, 2016

(51) Int. Cl.
 *G01R 33/48* (2006.01)
 *G01R 33/561* (2006.01)

(52) U.S. Cl.
 CPC ...... *G01R 33/4828* (2013.01); *G01R 33/5616* (2013.01)

(58) Field of Classification Search
 CPC .................. G01R 33/4828; G01R 33/5616
 See application file for complete search history.

(56) References Cited

U.S. PATENT DOCUMENTS

| 5,909,119 A * | 6/1999 | Zhang ............... G01R 33/4828 324/307 |
| 8,242,780 B2 | 8/2012 | Geppert et al. |
| 2006/0094952 A1 | 5/2006 | Ma et al. |
| 2008/0048659 A1* | 2/2008 | Reeder ............... G01R 33/4824 324/312 |
| 2011/0096974 A1* | 4/2011 | Gilson ............... G01R 33/4828 382/131 |
| 2012/0268120 A1 | 10/2012 | Hernando |

FOREIGN PATENT DOCUMENTS

| EP | 0950902 A2 | 10/1999 |
| WO | 2009-012115 A1 | 1/2009 |
| WO | 2010-113048 A1 | 10/2010 |

OTHER PUBLICATIONS

International Search Report and Written Opinion for International Application No. PCT/US2015/066030 dated Mar. 31, 2016. 3 pages.
J. Ma, C. Costelloe, J. Madewell, G. Hortobagyi, M. Green, G. Cao, F. Sun, V. Kundra; "Multisequence and Multiplanar Whole Body MRI for Detection of Cancer Metastases"; Proc. Intl. Soc. Mag. Reson. Med. 17 (2009); p. 2224.

* cited by examiner

*Primary Examiner* — Rodney Bonnette
(74) *Attorney, Agent, or Firm* — Grogan, Tuccillo & Vanderleeden, LLP (57) ABSTRACT

A method that includes obtaining an MRI gradient echo train of at least three echo data sets at differing phase angles; producing a plurality of phase error maps among the at least three echo data sets; and imaging at least three distinct chemical species based on the plurality of phase error maps.

23 Claims, 4 Drawing Sheets

METHOD AND APPARATUS FOR SEPARATING CHEMICAL SPECIES IN MAGNETIC RESONANCE IMAGING

BACKGROUND

Technical Field

Embodiments of the invention relate generally to magnetic resonance imaging (MRI). Particular embodiments relate to MRI of silicone implants.

Discussion of Art

In magnetic resonance imaging (MRI), human or other animal tissue is subjected to a uniform magnetic field, i.e., a polarizing field B0, so that the individual magnetic moments of particle spins in the tissue attempt to align with the polarizing field, but precess about the field in random order at their characteristic Larmor frequency. If the tissue is subjected to an RF magnetic field, i.e., excitation field B1, which defines an x-y plane and varies at a frequency near a Larmor frequency of selected particles, the net aligned moment, or "longitudinal magnetization" of those selected particles, may be rotated, or "tipped", into the x-y plane to produce a net transverse magnetic moment. After B1 is terminated, the tipped spins "relax" back into the precession defined by B0, and, as a result, produce RF signals. The RF signals may be received and processed to form an image. In order to form a pixelated image for human interpretation, gradient magnetic fields, Gx, Gy, Gz, are applied to localize the tissue response to B1. In order to distinguish different types of material within a pixelated image, MRI systems sometimes rely on material characteristics known as TR and TE, which are the times required for the tipped spins of a particular material to relax and to "echo" after removal of B1. The phase shift of a particular material's TE from the TE of water, at a given intensity of B0, is known as that material's "chemical shift."

MRI is increasingly preferred for medical imaging as it avoids exposing patients to radiation. Although useful for many purposes, current MRI techniques encounter difficulty in imaging silicone implants (such as those are used for cosmetic enhancement or repair) separate from surrounding body fat. For example, breast cancer survivors may have silicone implanted for breast reconstruction. Cosmetic surgeons generally find it desirable to follow up on the installation and fixation of such implants. However, MRI presently has difficulty providing images that distinguish the silicone from surrounding fat. This difficulty arises because fat and silicone, at typical diagnostic MRI intensities of 1.5 T-3 T, are believed to have closely similar chemical shifts, as close as 30 phase degrees offset from each other at typical gradient echo spacings used for fat-water separation.

In view of the above, it is desirable to provide apparatus and methods for obtaining images of in vivo silicone separate from fat. Such apparatus and methods might also be helpful toward images of other distinct chemical species even where certain of the chemical species have relatively close chemical phase shifts (i.e., as close as fat and silicone at 1.5 T magnitude of B0).

BRIEF DESCRIPTION

Embodiments of the invention implement a method that includes obtaining an MRI gradient echo train of at least three echo data sets at differing phase angles; producing a plurality of phase error maps among the at least three echo data sets; and imaging at least three distinct chemical species based on the plurality of phase error maps.

Other embodiments implement a method that includes obtaining an MRI gradient echo train of at least three echo data sets; producing an outer phase error map by performing a 2-point Dixon separation on non-consecutive out-of-phase first and second echo data sets of the MRI gradient echo train; modifying an in-phase third echo data set of the MRI gradient echo train according to the outer phase error map, wherein the third echo data set may be consecutive between the first and second echo data sets; producing a first phase error map by performing a 2-point Dixon separation on the first echo data set and the modified third echo data set; producing a second phase error map by performing a 2-point Dixon separation on the second echo data set and the modified third echo data set; and imaging fat and water, excluding in vivo silicone, based on the first and second phase error maps.

Other embodiments provide an apparatus that includes an MRI system control that is configured to obtain an MRI gradient echo train of at least three echo data sets; and an image processor module that is configured to produce a plurality of phase error maps among the at least three echo data sets, and to image at least two distinct chemical species based on the plurality of phase error maps.

Other embodiments provide an apparatus that includes an MRI system control that is configured to obtain an MRI gradient echo train of at least three echo data sets; and an image processor module that is configured to produce a first phase error map by performing a first 2-point Dixon separation on consecutive first and second echo data sets of the MRI gradient echo train; produce a second phase error map by performing a second 2-point Dixon separation on consecutive second and third echo data sets of the MRI gradient echo train; modify the non-consecutive first and third echo data sets according to the first and second phase error maps; produce a third phase error map by performing a third 2-point Dixon separation on the modified first and third echo data sets; and imaging fat and silicone, excluding water, based on the third phase error map.

Other embodiments implement a method that includes obtaining an MRI gradient echo train of at least three echo data sets; producing a first phase error map by performing a first 2-point Dixon separation on consecutive first and second echo data sets of the MRI gradient echo train, wherein the first echo data set may be out-of-phase and the second echo data set may be in-phase; producing a second phase error map by performing a second 2-point Dixon separation on consecutive second and third echo data sets of the MRI gradient echo train, wherein the third echo data set may be out-of-phase; modifying the non-consecutive out-of-phase first and third echo data sets according to the first and second phase error maps; producing a third phase error map by performing a third 2-point Dixon separation on the modified out-of-phase first and third echo data sets; and imaging in vivo silicone based on the third phase error map.

DRAWINGS

The present invention will be better understood from reading the following description of non-limiting embodiments, with reference to the attached drawings, wherein below.

DETAILED DESCRIPTION

Reference will be made below in detail to exemplary embodiments of the invention, examples of which are illustrated in the accompanying drawings. Wherever possible, the same reference characters used throughout the drawings refer to the same or like parts, without duplicative description. Although exemplary embodiments of the present invention are described with respect to water, fat, and silicone, embodiments of the invention also are applicable for use generally for imaging any three chemical species that have mutual chemical shifts substantially similar to those of water, fat, and silicone.

As used herein, the terms "substantially," "generally," and "about" indicate conditions within reasonably achievable manufacturing and assembly tolerances, relative to ideal desired conditions suitable for achieving the functional purpose of a component or assembly.

Figure 1:
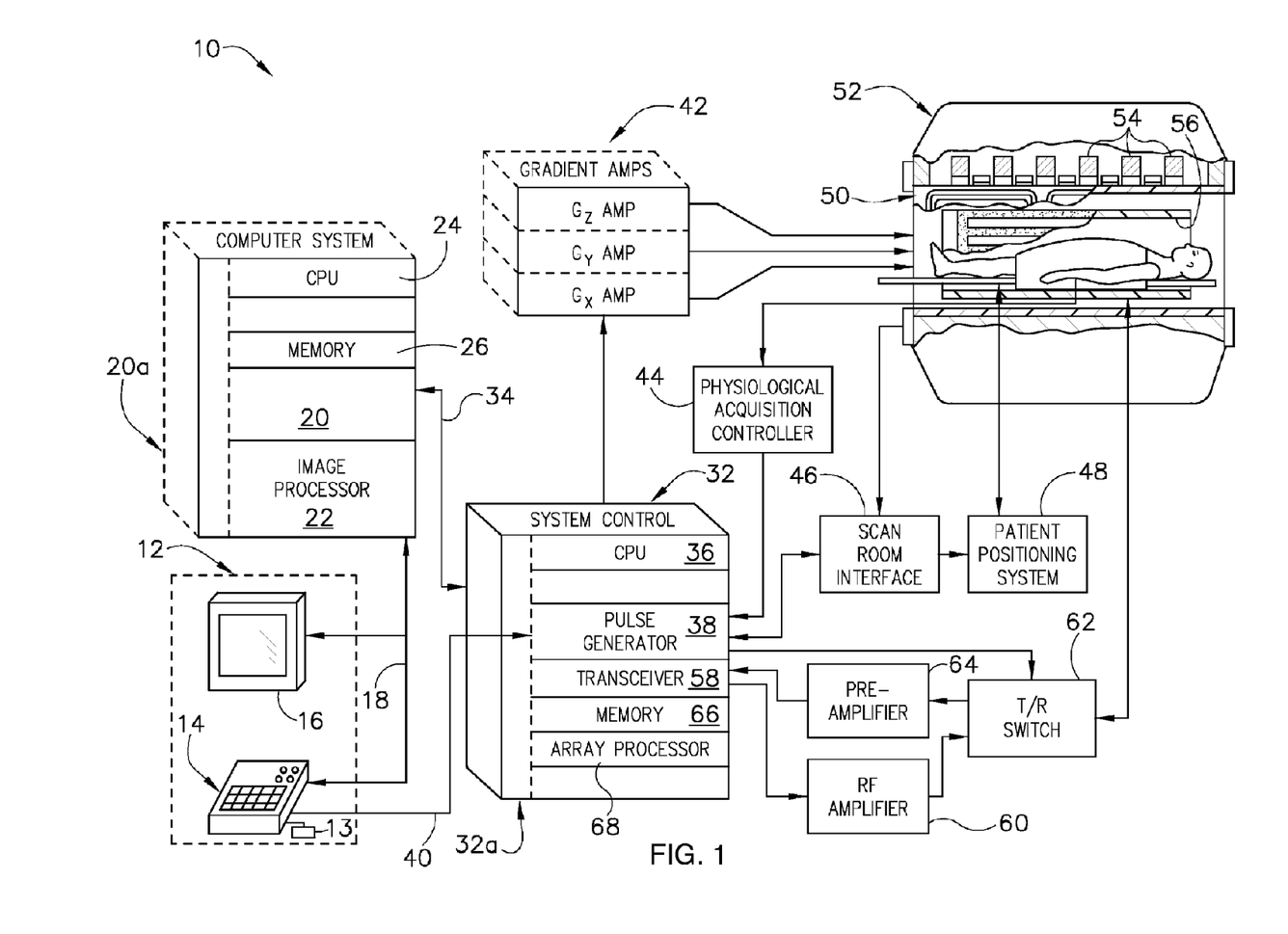
FIG. 1 shows schematically an exemplary magnetic resonance imaging (MRI) system that incorporates embodiments of the present invention.

FIG. 1 shows major components of an exemplary magnetic resonance imaging (MRI) system 10 that incorporates embodiments of the present invention. The operation of the system is controlled from an operator console 12, which includes a keyboard or other input device 13, a control panel 14, and a display screen 16. The input device 13 can include a mouse, joystick, keyboard, track ball, touch activated screen, light wand, voice control, or any similar or equivalent input device, and may be used for interactive geometry prescription. The console 12 communicates through a link 18 with a separate computer system 20 that enables an operator to control the production and display of images on the display screen 16. The computer system 20 includes a number of modules that communicate with each other through a backplane 20a. The modules of the computer system 20 include an image processor module 22, a CPU module 24 and a memory module 26 that may include a frame buffer for storing image data arrays. The computer system 20 is linked to archival media devices, permanent or back-up memory storage or a network for storage of image data and programs, and communicates with a separate MRI system control 32 through a high-speed signal link 34. The computer system 20 and the MRI system control 32 collectively form an "MRI controller" 20, 32. According to embodiments and aspects of the invention, the MRI controller 20, 32 is configured to accomplish a method for separately imaging water, fat, and silicone, for example by implementing an exemplary algorithm that is further discussed below.

The MRI system control 32 includes a set of modules connected together by a backplane 32a. These include a CPU module 36 as well as a pulse generator module 38. The CPU module 36 connects to the operator console 12 through a serial link 40. It is through link 40 that the MRI system control 32 receives commands from the operator to indicate the scan sequence that is to be performed. The CPU module 36 operates the system components to carry out the desired scan sequence and produces data which indicates the timing, strength and shape of the RF pulses produced, and the timing and length of the data acquisition window. The CPU module 36 connects to several components that are operated by the MRI controller 20, 32, including the pulse generator module 38 (which controls a gradient amplifier 42, further discussed below), a physiological acquisition controller ("PAC") 44, and a scan room interface circuit 46.

The CPU module 36 receives patient data from the physiological acquisition controller 44, which receives signals from a number of different sensors connected to the patient, such as ECG signals from electrodes attached to the patient. And finally, the CPU module 36 receives from the scan room interface circuit 46, signals from various sensors associated with the condition of the patient and the magnet system. It is also through the scan room interface circuit 46 that the MRI controller 20, 32 commands a patient positioning system 48 to move the patient or client C to a desired position for the scan.

The pulse generator module 38 operates the gradient amplifiers 42 to achieve desired timing and shape of the gradient pulses that are produced during the scan. The gradient waveforms produced by the pulse generator module 38 are applied to the gradient amplifier system 42 having Gx, Gy, and Gz amplifiers. Each gradient amplifier excites a corresponding physical gradient coil in a gradient coil assembly, generally designated 50, to produce the magnetic field gradients used for spatially encoding acquired signals. The gradient coil assembly 50 forms part of a magnet assembly 52, which also includes a polarizing magnet 54 (which, in operation, provides a homogeneous longitudinal magnetic field B0) and a whole-body RF coil 56 (which, in operation, provides a transverse magnetic field B1 that is generally perpendicular to B0). In an embodiment of the invention, RF coil 56 is a multi-channel coil. A transceiver module 58 in the MRI system control 32 produces pulses that are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 32 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either transmit mode or receive mode.

After the multi-channel RF coil 56 picks up the RF signals produced from excitation of the target, the transceiver module 58 digitizes these signals. The MRI controller 20, 32 then processes the digitized signals by Fourier transform to produce k-space data, which then is transferred to a memory module 66, or other computer readable media, via the MRI system control 32. "Computer readable media" may include, for example, structures configured so that electrical, optical, or magnetic states may be fixed in a manner perceptible and reproducible by a conventional computer: e.g., text or images printed to paper or displayed on a screen, optical discs, or other optical storage media; "flash" memory, EEPROM, SDRAM, or other electrical storage media; floppy or other magnetic discs, magnetic tape, or other magnetic storage media.

A scan is complete when an array of raw k-space data has been acquired in the computer readable media 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long-term storage or it may be further processed by the image processor 22 and conveyed to the operator console 12 and presented on the display 16.

In a magnetic resonance sequence scan, such as a fast spin echo or fast triple echo Dixon (FTED) scan, the raw k-space data incorporates signals from multiple chemical species that have distinct resonant frequencies and therefore precess at distinct phase intervals following removal of the magnetic B0 field. The precessing phase interval of a particular chemical species, with reference to the precession of water molecules, is known herein as the "chemical shift" of the particular chemical species. Of particular interest for exemplary embodiments of the invention are water, fat, and silicone. For RF frequencies of interest (0 to 300 Hz, for 1.5 T B0 intensity), fat and silicone have fairly similar chemical shifts (both about 30-40 degrees apart from water for typical echo spacings). This makes it difficult to distinguish fat from silicone using only two consecutive echoes.

Figure 2:
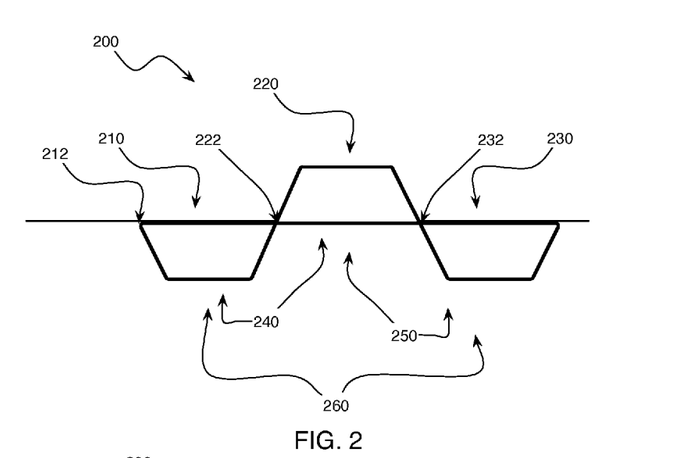
FIG. 2 shows schematically an MRI gradient echo train as utilized by embodiments of the invention.

One solution has been to undertake 3-point separation but this introduces phase uncertainties. Accordingly, embodiments of the present invention implement 2-point Dixon separation on a gradient echo train that includes at least three echoes. FIG. 2 shows an exemplary gradient echo train 200, which includes a first echo data set 210 at a first phase angle 212, a second echo data set 220 at a second phase angle 222, and a third echo data set 230 and a third phase angle 232. The echo data sets 210, 220, 230 form a first echo pair 240, a second echo pair 250, and an outer echo pair 260. The MRI gradient echo train 200 can be obtained by a fast triple echo Dixon (FTED) RF pulse sequence, or by a dynamic contrast enhance sequence. The MRI gradient echo train 200 can be obtained in a single scan using a bipolar readout, or in multiple scans.

Figure 3:
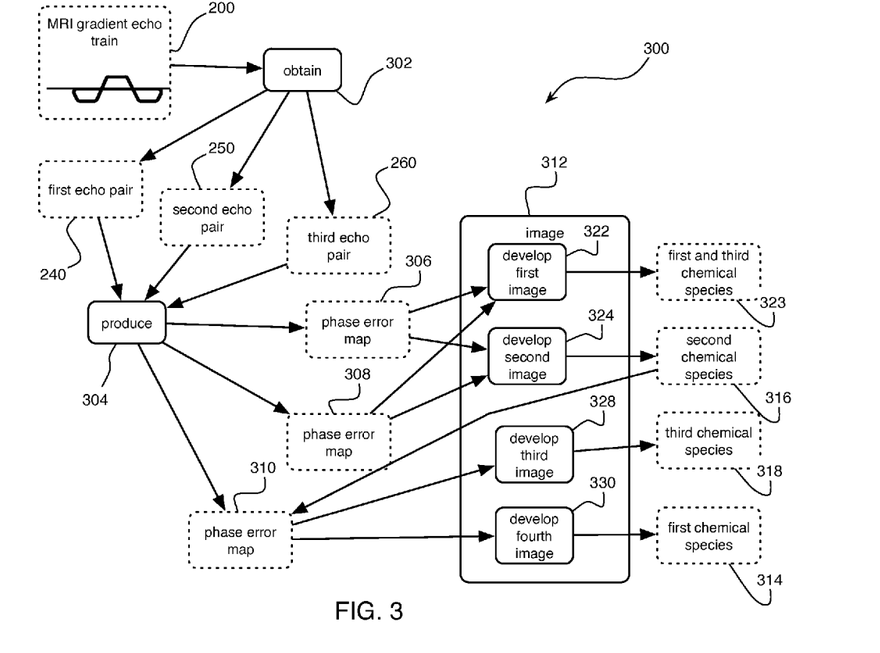
FIG. 3 shows schematically a first implementation of a method according to the invention.

With reference to FIG. 2, FIG. 3 shows a first method 300 for implementing the invention. The method 300 includes obtaining 302 the MRI gradient echo train 200, and producing 304 a plurality of phase error maps 306, 308, 310 among the at least three echo data sets 210, 220, 230. A first of the plurality of phase error maps, e.g., phase error map 306, is obtained based on the first echo pair 240. A second of the plurality of phase error maps, e.g., phase error map 308, is obtained based on the second echo pair 250. A third of the plurality of phase error maps, e.g., phase error map 310, is obtained based on the outer echo pair 260. The method 300 further includes imaging 312 at least three distinct chemical species 314, 316, 318 based on the plurality of phase error maps 306, 308, 310. For example, separate images of fat 314, water 316, and silicone 318 can be obtained without use of inversion or suppression pulses. Imaging 312 the three distinct chemical species 314 . . . 318, generally, can include developing a first image 322 of the combined first and third chemical species 323 (e.g., fat and silicone) and developing a second image 324 of the second chemical species 316 (e.g., water) based on the first and second phase error maps 306, 308; and developing a third image 328 of the third chemical species 318 (e.g., silicone) and a fourth image 330 of the first chemical species 314 (e.g., fat), which have a relative chemical phase shift closer to each other than to the second chemical species, based on the outer phase error map 310 and on the images modified by the second chemical species 316 (e.g., water).

Figure 4:
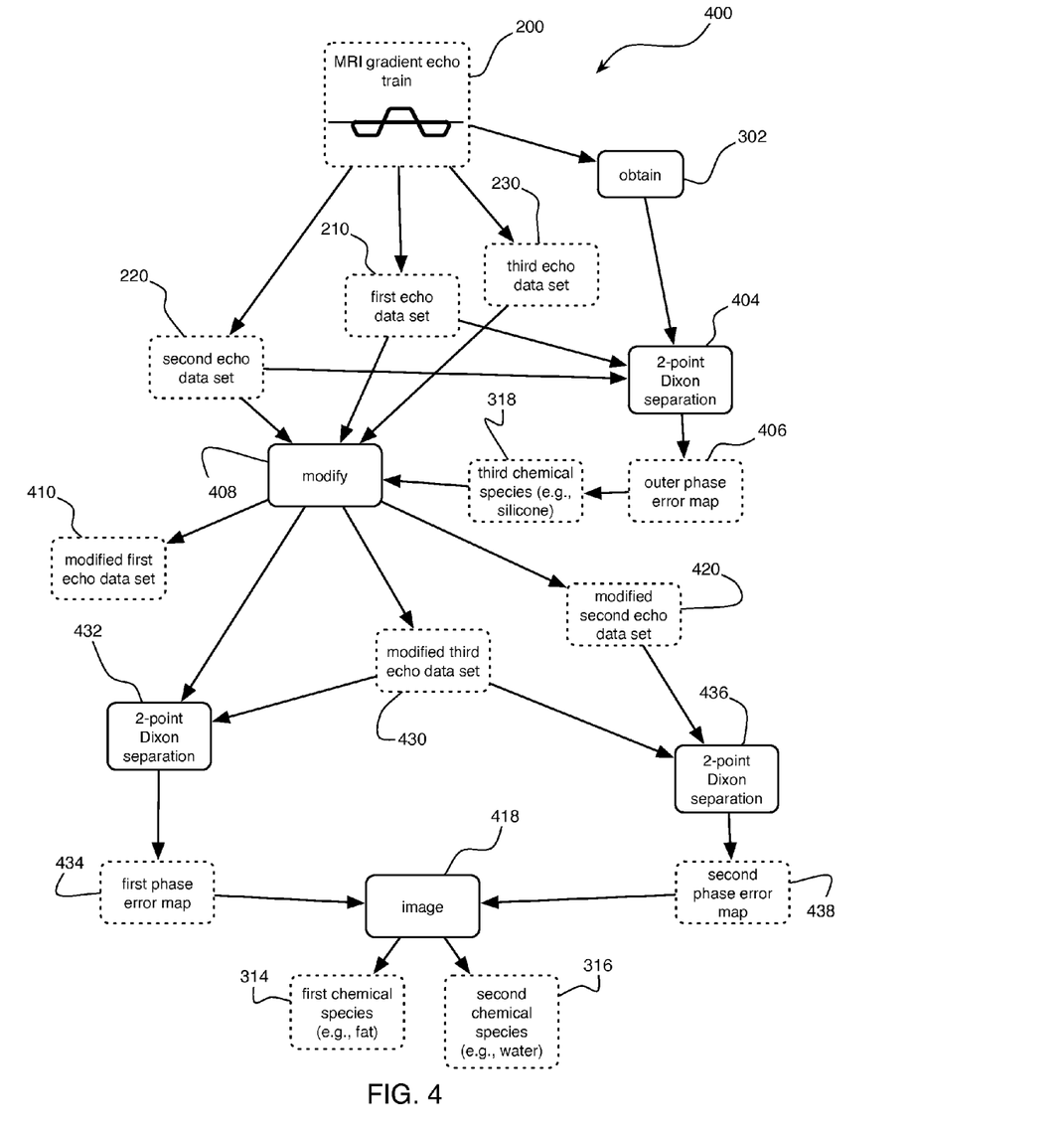
FIG. 4 shows schematically a second implementation of a method according to the invention.

Still referring to FIG. 2, FIG. 4 shows a second method 400 for implementing the invention. The method 400 includes obtaining 302 the MRI gradient echo train 200, producing an outer phase error map 406 by performing 2-point Dixon separation 404 on the non-consecutive out-of-phase first and second echo data sets 210, 230 (outer echo pair 260), and modifying 408 the echo data sets 210, 220, 230 to produce modified echo data sets 410, 420, 430, according to the third chemical species 318. The method 400 further includes producing a first phase error map 434 by performing a 2-point Dixon separation 432 on the modified first echo data set 410 and the modified third echo data set 430, producing a second phase error map 438 by performing a 2-point Dixon separation 436 on the modified second echo data set 420 and the modified third echo data set 430, and then imaging 418 fat 314 and water 316, excluding in vivo silicone 318, on the basis of the first and second phase error maps 434, 438.

Figure 5:
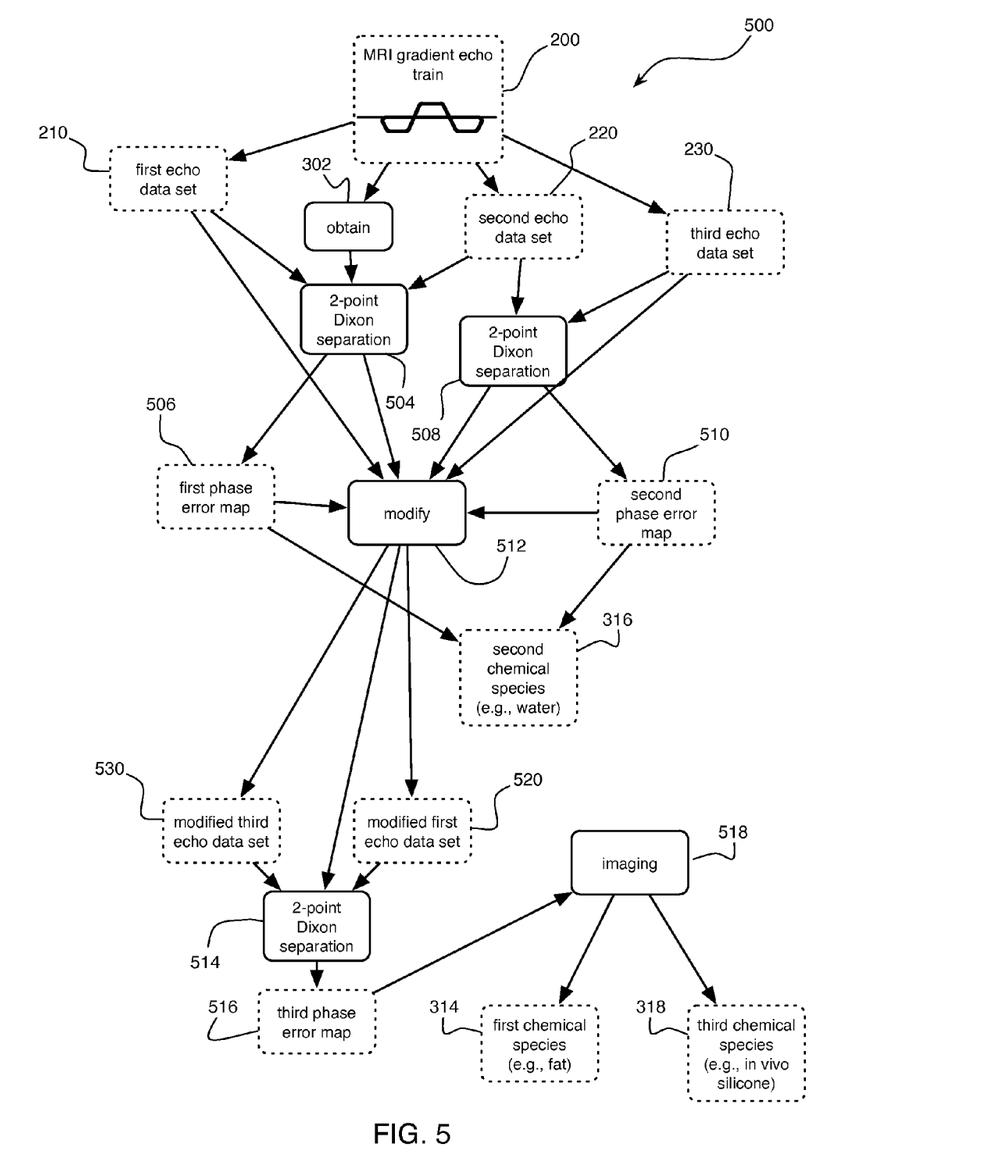
FIG. 5 shows schematically a third implementation of a method according to the invention.

FIG. 5 shows a third method 500 for implementing the invention. The method 500 includes obtaining 302 the MRI gradient echo train 200; producing a first phase error map 506 by performing a first 2-point Dixon separation 504 on consecutive first and second echo data sets 210, 220 of the MRI gradient echo train; and producing a second phase error map 510 by performing a second 2-point Dixon separation 508 on consecutive second and third echo data sets 220, 230 of the MRI gradient echo train 200. Based on the first and second phase error maps 506, 510, a water image 316 can be produced. The method 500 further includes modifying 512 the non-consecutive first and third echo data sets 210, 230 to produce modified first and third echo data sets 520, 530 according to the first and second phase error maps 506, 510; producing a third phase error map 516 by performing a third 2-point Dixon separation 514 on the modified first and third echo data sets; and imaging 518 fat 314 and in vivo silicone 318 based on the third phase error map 516.

Advantageously, the methods of FIGS. 3-5 can be implemented in the image processor 22 and the system control 32 of the MRI system 100 as discussed with reference to FIG. 1. In particular, the MRI system control 32 can obtain 302 the MRI gradient echo train 200, while the image processor 22 can be configured to implement the steps of any of the methods 300, 400, or 500.

Thus, embodiments of the invention implement a method that includes obtaining an MRI gradient echo train of at least three echo data sets at differing echo times; producing a plurality of phase error maps among the at least three echo data sets; and imaging at least three distinct chemical species based on the plurality of phase error maps. For example, the MRI gradient echo train may be obtained by a fast spin echo triple echo Dixon sequence; in a single scan using a bipolar readout; by dynamic contrast enhanced sequence; by parallel imaging; by multi-pass imaging. According to certain embodiments, images of water, fat, and silicone may be obtained without use of inversion or suppression pulses. In such embodiments, imaging water, fat, and silicone may include developing a first fat image from a first phase error map and developing a second fat image from a second phase error map, and modifying at least some of the at least three echo data sets according to the first and second fat images.

Other embodiments implement a method that includes obtaining an MRI gradient echo train of at least three echo data sets; producing an outer phase error map by performing a 2-point Dixon separation on non-consecutive out-of-phase first and second echo data sets of the MRI gradient echo train; modifying an in-phase third echo data set of the MRI gradient echo train according to the outer phase error map, wherein the third echo data set may be consecutive between the first and second echo data sets; producing a first phase error map by performing a 2-point Dixon separation on the first echo data set and the modified third echo data set;

producing a second phase error map by performing a 2-point Dixon separation on the second echo data set and the modified third echo data set; and imaging fat and water, excluding in vivo silicone, based on the first and second phase error maps. Accordingly, separate images of water, fat, and silicone are obtained without use of inversion or suppression pulses. Modifying the third echo data set may include developing a silicone image from the outer phase error map and modifying the third echo data set according to the silicone image.

Other embodiments provide an apparatus that includes an MRI system control that is configured to obtain an MRI gradient echo train of at least three echo data sets; and an image processor module that is configured to produce a plurality of phase error maps among the at least three echo data sets, and to image at least two distinct chemical species based on the plurality of phase error maps. For example, the image processor module may be configured to produce an outer phase error map that may be obtained by performing a 2-point Dixon separation on non-consecutive out-of-phase first and second echo data sets of the MRI gradient echo train; to modify an in-phase third echo data set of the MRI gradient echo train according to the outer phase error map, wherein the third echo data set may be consecutive between the first and second echo data sets; to produce a first phase error map by performing a 2-point Dixon separation on the first echo data set and the modified third echo data set; to produce a second phase error map by performing a 2-point Dixon separation on the second echo data set and the modified third echo data set; and to image water and fat, excluding in vivo silicone, based on the first and second phase error maps. The MRI system control be configured to obtain the MRI gradient echo train by a fast spin echo triple echo Dixon sequence; in a single scan using a bipolar readout; in multiple scans. Accordingly, separate images of water, fat, and silicone may be obtained without use of inversion or suppression pulses.

Other embodiments provide an apparatus that includes an MRI system control that is configured to obtain an MRI gradient echo train of at least three echo data sets; and an image processor module that is configured to produce a first phase error map by performing a first 2-point Dixon separation on consecutive first and second echo data sets of the MRI gradient echo train; produce a second phase error map by performing a second 2-point Dixon separation on consecutive second and third echo data sets of the MRI gradient echo train; modify the non-consecutive first and third echo data sets according to the first and second phase error maps; produce a third phase error map by performing a third 2-point Dixon separation on the modified first and third echo data sets; and image in vivo silicone based on the third phase error map.

Other embodiments implement a method that includes obtaining an MRI gradient echo train of at least three echo data sets; producing a first phase error map by performing a first 2-point Dixon separation on consecutive first and second echo data sets of the MRI gradient echo train, wherein the first echo data set may be out-of-phase and the second echo data set may be in-phase; producing a second phase error map by performing a second 2-point Dixon separation on consecutive second and third echo data sets of the MRI gradient echo train, wherein the third echo data set may be out-of-phase; modifying the non-consecutive first and third echo data sets according to the first and second phase error maps; producing a third phase error map by performing a third 2-point Dixon separation on the modified out-of-phase first and third echo data sets; and imaging in vivo silicone based on the third phase error map.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. While the dimensions and types of materials described herein are intended to define the parameters of the invention, they are by no means limiting and are exemplary embodiments. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, terms such as "first," "second," "third," "upper," "lower," "bottom," "top," etc. are used merely as labels, and are not intended to impose numerical or positional requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose several embodiments of the invention, including the best mode, and also to enable one of ordinary skill in the art to practice embodiments of the invention, including making and using any devices or systems and performing any incorporated methods. The patentable scope of the invention is defined by the claims, and may include other examples that occur to one of ordinary skill in the art. Such other examples are intended to be within the scope of the claims if they have structural elements that do not differ from the literal language of the claims, or if they include equivalent structural elements with insubstantial differences from the literal language of the claims.

As used herein, an element or step recited in the singular and proceeded with the word "a" or "an" should be understood as not excluding plural of the elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described—, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. A method comprising:
    obtaining an MRI gradient echo train of at least three echo data sets of signals at differing phase angles;
    producing a plurality of phase error maps among the at least three echo data sets;

imaging at least three distinct chemical species based on the plurality of phase error maps; and wherein the plurality of phase error maps includes an outer phase error map that corresponds to an outer echo pair.

2. The method of claim 1 wherein the MRI gradient echo train is obtained by a fast spin echo triple echo Dixon sequence.

3. The method of claim 1 wherein the MRI gradient echo train is obtained in a single scan using a bipolar readout.

4. The method of claim 1 wherein the MRI gradient echo train is obtained by dynamic contrast enhanced sequence.

5. The method of claim 1 wherein the MRI gradient echo train is obtained by parallel imaging.

6. The method of claim 1 wherein separate images of water, fat, and silicone are obtained without use of inversion or suppression pulses.

7. The method of claim 6 wherein imaging water, fat, and silicone includes developing a first fat image from a first phase error map and developing a second fat image from a second phase error map, and modifying at least some of the at least three echo data sets according to the first and second fat images.

8. A method comprising:
obtaining an MRI gradient echo train of at least three echo data sets, wherein the third echo data set is consecutive between the first and second echo data sets;
producing an outer phase error map by performing a 2-point Dixon separation on the non-consecutive first and second echo data sets of the MRI gradient echo train;
modifying the at least three echo data sets of the MRI gradient echo train according to the outer phase error map;
producing a first phase error map by performing a 2-point Dixon separation on the modified first echo data set and the modified third echo data set;
producing a second phase error map by performing a 2-point Dixon separation on the modified second echo data set and the modified third echo data set; and
imaging fat and water, excluding in vivo silicone, based on the first and second phase error maps.

9. The method of claim 8 wherein the MRI gradient echo train is obtained by a fast spin echo triple echo Dixon sequence.

10. The method of claim 8 wherein the MRI gradient echo train is obtained in a single scan using a bipolar readout.

11. The method of claim 8 wherein the MRI gradient echo train is obtained in multiple scans.

12. The method of claim 8 wherein separate images of water, fat, and silicone are obtained without use of inversion or suppression pulses.

13. The method of claim 8 wherein modifying the at least three echo data sets includes developing a silicone image from the outer phase error map and subtracting the silicone image from the echo data sets.

14. An apparatus comprising:
an MRI system control that is configured to obtain an MRI gradient echo train of at least three echo data sets, wherein the third echo data set is consecutive between the first and second echo data sets;
an image processor module that is configured to produce a plurality of phase error maps among the at least three echo data sets, and to image at least two distinct chemical species based on the plurality of phase error maps; and wherein the plurality of phase error maps includes an outer phase error map that corresponds to an outer echo pair.

15. The apparatus of claim 14 wherein the image processor module is configured:
to produce the outer phase error map by performing a 2-point Dixon separation on non-consecutive out-of-phase first and second echo data sets of the MRI gradient echo train;
to modify echo data sets of the MRI gradient echo train according to the outer phase error map;
to produce a first phase error map by performing a 2-point Dixon separation on the modified first echo data set and the modified third echo data set;
to produce a second phase error map by performing a 2-point Dixon separation on the modified second echo data set and the modified third echo data set; and
to image water and fat, excluding in vivo silicone, based on the first and second phase error maps.

16. The apparatus of claim 14 wherein the MRI gradient echo train is obtained by a fast spin echo triple echo Dixon sequence.

17. The apparatus of claim 14 wherein the MRI gradient echo train is obtained in a single scan using a bipolar readout.

18. The apparatus of claim 14 wherein the MRI gradient echo train is obtained in multiple scans.

19. The apparatus of claim 14 wherein separate images of water, fat, and silicone are obtained without use of inversion or suppression pulses.

20. The method of claim 19 wherein the MRI gradient echo train is obtained in a single scan using a bipolar readout and a fast spin echo triple echo Dixon sequence.

21. The method of claim 19 wherein the MRI gradient echo train is obtained in multiple scans.

22. An apparatus comprising:
an MRI system control that is configured to obtain an MRI gradient echo train of at least three echo data sets; and
an image processor module that is configured to produce a first phase error map by performing a first 2-point Dixon separation on consecutive first and second echo data sets of the MRI gradient echo train; produce a second phase error map by performing a second 2-point Dixon separation on consecutive second and third echo data sets of the MRI gradient echo train; modify the non-consecutive first and third echo data sets according to the first and second phase error maps; produce a third phase error map by performing a third 2-point Dixon separation on the modified first and third echo data sets; and image three chemical species based on the three phase error maps.

23. A method comprising:
obtaining an MRI gradient echo train of at least three echo data sets;
producing a first phase error map by performing a first 2-point Dixon separation on consecutive first and second echo data sets of the MRI gradient echo train, wherein the first echo data set is out-of-phase and the second echo data set is in-phase;
producing a second phase error map by performing a second 2-point Dixon separation on consecutive second and third echo data sets of the MRI gradient echo train, wherein the third echo data set is out-of-phase;
modifying the non-consecutive out-of-phase first and third echo data sets according to the first and second phase error maps;

producing a third phase error map by performing a third 2-point Dixon separation on the modified out-of-phase first and third echo data sets; and imaging three chemical species based on the three phase error maps.

\* \* \* \* \*